US008669887B2

(12) United States Patent
Ward, III

(10) Patent No.: US 8,669,887 B2
(45) Date of Patent: Mar. 11, 2014

(54) TURNTABLE-MOUNTED KEYPAD

(71) Applicant: Joseph G. Ward, III, Dorchester, MA (US)

(72) Inventor: Joseph G. Ward, III, Dorchester, MA (US)

( * ) Notice: Subject to any disclaimer, the term of this patent is extended or adjusted under 35 U.S.C. 154(b) by 0 days.

(21) Appl. No.: 13/968,985

(22) Filed: Aug. 16, 2013

(65) Prior Publication Data

US 2013/0335244 A1 Dec. 19, 2013

Related U.S. Application Data

(63) Continuation of application No. 12/868,713, filed on Aug. 25, 2010, now Pat. No. 8,514,106.

(60) Provisional application No. 61/236,916, filed on Aug. 26, 2009.

(51) Int. Cl.
*H03M 11/00* (2006.01)

(52) U.S. Cl.
USPC ........................................................ 341/22

(58) Field of Classification Search
USPC ........ 341/22; 715/781, 702; 710/5; 700/94, 1
See application file for complete search history.

(56) References Cited

U.S. PATENT DOCUMENTS

2008/0046098 A1* 2/2008 Corbin et al. .................... 700/1

* cited by examiner

*Primary Examiner* — Hieu Nguyen
(74) *Attorney, Agent, or Firm* — BainwoodHuang

(57) ABSTRACT

A keypad for controlling software, such as disk jockey (DJ) software, includes a plurality of keys, each key being programmable for issuing any desired, predefined sequence of keystrokes and/or mouse commands in response to the key being pressed. At least some of the keys are laid out in a piano-style format, with those keys being programmed to direct the software to produce musical notes. The keypad is constructed to be attached to a phonograph turntable by engaging with physical features on the turntable. The keypad has a top surface that has a rounded edge that runs concentrically with the turntable's platter. It also has a straight edge, overhanging the side of the turntable, where the piano style keys are positioned. When used by a DJ, the keypad greatly simplifies the task of simultaneously operating the turntable and the DJ software.

20 Claims, 6 Drawing Sheets

TURNTABLE-MOUNTED KEYPAD

CROSS-REFERENCES TO RELATED APPLICATIONS

This application is a continuation of U.S. application Ser. No. 12/868,713, filed Aug. 25, 2010 (now issued as U.S. Pat. No. 8,514,106), which in turn claims the benefit of U.S. Provisional Application No. 61/236,916, filed Aug. 26, 2010, the contents and teachings of which are hereby incorporated by reference in their entirety.

STATEMENT REGARDING FEDERALLY SPONSORED RESEARCH OR DEVELOPMENT

Not Applicable.

NAMES OF PARTIES TO A JOINT RESEARCH AGREEMENT

Not Applicable

REFERENCE TO A "SEQUENCE LISTING," A TABLE, OR A COMPUTER PROGRAM LISTING APPENDIX

Not Applicable.

BACKGROUND OF THE INVENTION

1. Field of the Invention

This invention relates generally to disk jockeying hardware, and, more particularly, to devices used by disk jockeys in connection with computers to produce sounds, sound effects, and other effects.

2. Description of Related Art

Recent developments in digital audio have brought many advances to the art of disk jockeying. What began many decades ago with disk jockeys (or "DJs") playing vinyl records on analog turntables has evolved into a highly computerized process. Today's equipment typically includes a computer that stores digitally encoded songs and other recordings. The computer runs software for playing selected recordings through one or more amplifiers and loudspeakers. The DJ can control the software using a keyboard and pointer device, such as a mouse or touchpad, for introducing various sound effects and other effects into the performance.

As disk jockeying has moved from the analog to the digital domain, an unexpected survivor has been the analog turntable, although its role has been transformed. Rather than being the source of a musical signal for audio playback, it is now more often used as a special effects device. The turntable now typically plays a specially encoded disk, which includes timing and/or pitch information, but no music. The turntable's analog output signal is converted to digital format and piped into a USB port of the computer. The software links the information from the disk with the music being played and modifies playback in response to movements of the disk by the DJ. The DJ can speed up, slow down, reverse, or "scratch" the music being played by manually controlling the disk on the turntable, with the overall effects being similar to those which would be produced if the DJ were performing the same movements on a vinyl analog music recording.

The turntable has thus been transformed into a control device, for inputting signals to the computer for controlling the playback of digital audio. A typical setup may include two turntables, with their outputs combined and sent to the computer over a single USB port. The DJ generally controls one turntable with each hand. The setup also typically includes a microphone, for allowing voice-over, and a mixer for combining outputs from the computer and the microphone.

Examples of DJ software currently in use include "Scratch Live" by Serato Audio Research of Auckland, New Zealand, "Final Scratch" by Stanton Magnetics of Hollywood, Fla., "Traktor" by Native Instruments of Los Angeles, Calif., and "Torque" by M-Audio of Irwindale, Calif. Each company provides time and/or pitch encoded records for use with their software, i.e., "Control Vinyl" from Serato, "FS Standard Records" from Stanton, "Time Code Vinyl" from Native Instruments, and "Torque Control Vinyl" from M-Audio.

In addition to using a turntable to control playback, the DJ may also use various control functions built into the software. These include setting cue points in the music to which playback can proceed after a command is entered, specifying start and stop points for looping segments of playback, issuing MIDI commands, and other functions. These functions are generally programmed and activated using the computer's keyboard and pointer device. Often, sequences of commands (macros) can be defined in the software. The DJ can invoke these macros by entering predefined key combinations or clicks of the pointer device.

BRIEF SUMMARY OF THE INVENTION

Although the conventional arrangement provides a great deal of flexibility for enhancing musical playback, we have recognized it is also sometimes difficult to control. Once a song is selected for playback, the DJ's attention is focused primarily on the turntables. When the DJ then needs to control the software, the DJ may find it difficult to switch attention and the position of his or her hands back to the computer. This is especially the case when the computer is in a different place from the turntables, such as on a different surface, so that the DJ has to swivel and reorient to access the computer. Performances can sometimes suffer on account of the delays involved when the DJ switches focus.

What is needed, therefore, is a more convenient way for the DJ to control the computer during playback, which avoids the need for the DJ having continually to refocus his or her attention.

In accordance with one embodiment, a keypad for controlling disk jockey software from a location of a turntable includes a top surface and a bottom surface, the top surface having a plurality of keys. The keypad further includes a front edge and a back edge, the front edge having the shape of a circular arc. The keypad includes at least one of a hole in the keypad and a vertical member extending down from the keypad, for horizontally stabilizing the keypad with respect to the turntable, and a bracket extending down from the bottom surface of the keypad, for facilitating attachment of the keypad to the turntable.

According to another embodiment, a keypad for controlling disk jockey software from a location of a turntable includes a top surface and a bottom surface, the top surface having a plurality of keys. The keypad further includes a horizontal anchor, formed within or extending from the keypad, for engaging a top surface of the turntable, and a clamping member extending from the bottom surface of the keypad, for clamping to a side surface of the turntable.

According to yet another embodiment, an apparatus for controlling an audio or multimedia performance includes a turntable, a keypad attached to or integral with the turntable, and a computing device, operatively connected to the keypad, for running software that responds to keystrokes from the keypad for controlling the audio or multimedia performance.

According to still another embodiment, a turntable includes a platter, a plurality of keys, a processor for determining which of the plurality of keys has been pressed, and a digital communication port for outputting information associated with keystrokes from any of the plurality of keys to a computing device.

According to a still further embodiment, a method of controlling an audio or multimedia performance involves a turntable, a keypad attached to or integral with the turntable, and a computing device operatively connected to the keypad. The computing device runs software for playing music in response to time-encoded signals from a time-encoded disk. The method includes playing a time-encoded disk on the turntable, playing a musical selection from the computing device, and pressing keys on the keypad attached to or integral with the turntable to induces elected effects in connection with the music being played.

DETAILED DESCRIPTION OF THE INVENTION

As used throughout this document, the words "comprising," "including," and "having" are intended to set forth certain items, steps, elements, or aspects of something in an open-ended fashion.

Figure 1:
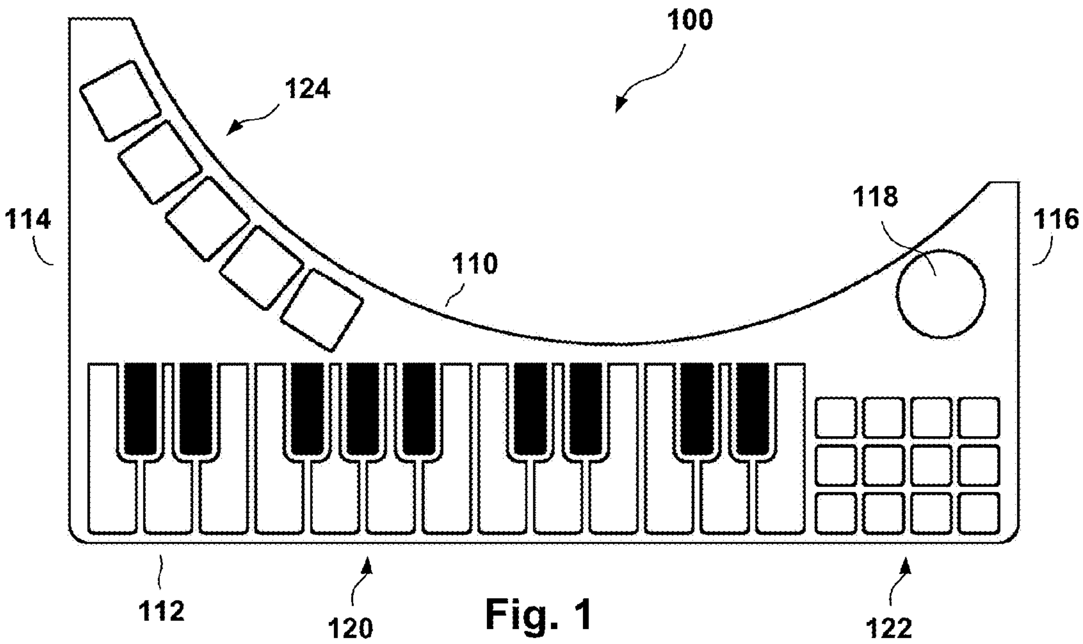
FIG. 1 is a top view of a keypad according to an embodiment of the invention.

FIG. 1 shows a keypad circuit board 100 according to an illustrative embodiment of the invention. The keypad circuit board 100 preferably has a top edge 110 in the shape of a circular arc and a straight bottom edge 112. The keypad circuit board 100 preferably has straight sides 114 and 116, which are square with the bottom edge 112. A hole 118 is provided at the upper-right of the keypad circuit board 100.

The keypad circuit board 100 includes a plurality of keys. These preferably include a first group of keys 120, a second group of keys 122, and a third group of keys 124. The first group of keys 120 is provided in the shape of piano keys, including both white and black keys.

Figure 2:
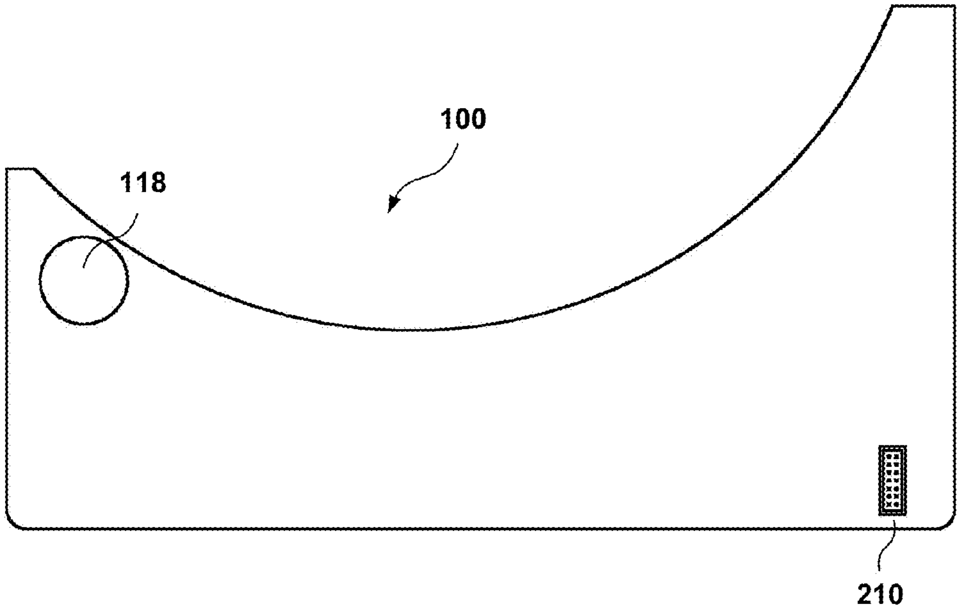
FIG. 2 is a bottom view of the keypad of FIG. 1.

FIG. 2 is a rear view of the keypad circuit board 100. As shown, the keypad circuit board 100 further includes an electrical connector 210, such as a 14-pin DIN connector. Each of the keys on the keypad circuit board 100 is wired to the connector 210, and the connector 210 presents electrical signals that indicate which of the plurality of keys have been pressed.

The keys of the keypad circuit board 100 are preferably arranged in an electrical matrix of rows and columns, wherein each key is positioned at the intersection of one row and one column. When a key is pressed, it electrically connects the row with the column, causing an electrical change of state which can be detected at the electrical signals on the connector 210. This arrangement is similar to the one commonly used in computer keyboards.

The connector 210 includes a plurality of conductors (e.g., fourteen) that convey electrical signals to external hardware. These conductors preferably include one conductor for each row of the matrix and one conductor for each column of the matrix used by the keypad circuit board 100.

The keypad circuit board 100 is preferably implemented with an insulative substrate, such as fiberglass, and conductive traces formed upon or within the substrate. The keys are preferably implemented as membrane switches, which are similar to those commonly used on microwave ovens and other appliances.

Figure 3:
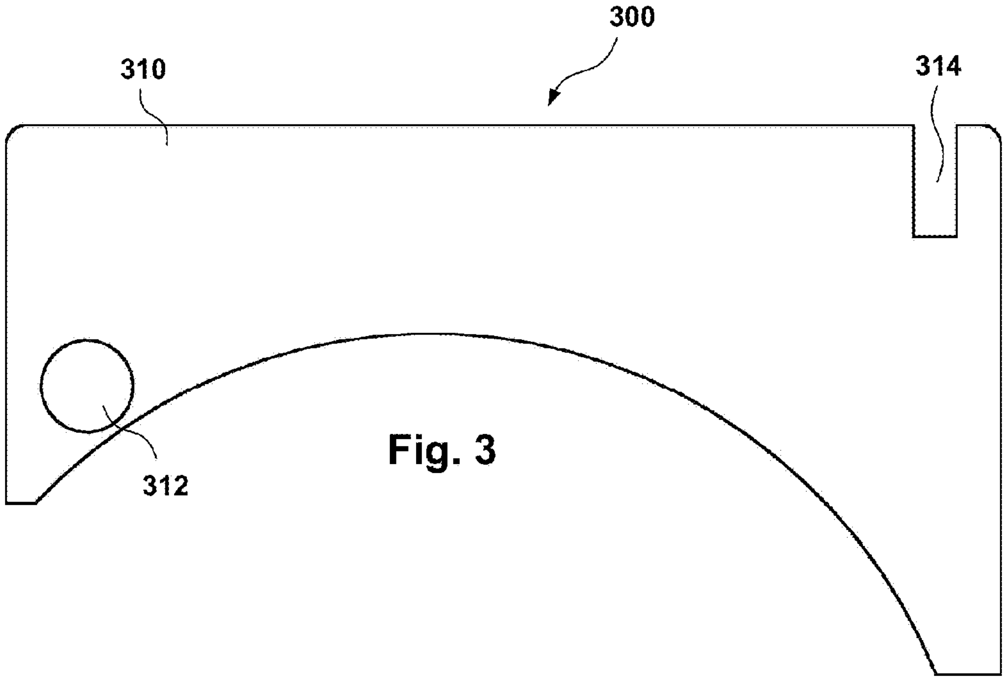
FIG. 3 is a top view of a base to which the keypad of FIG. 1 is normally attached.
Figure 4:
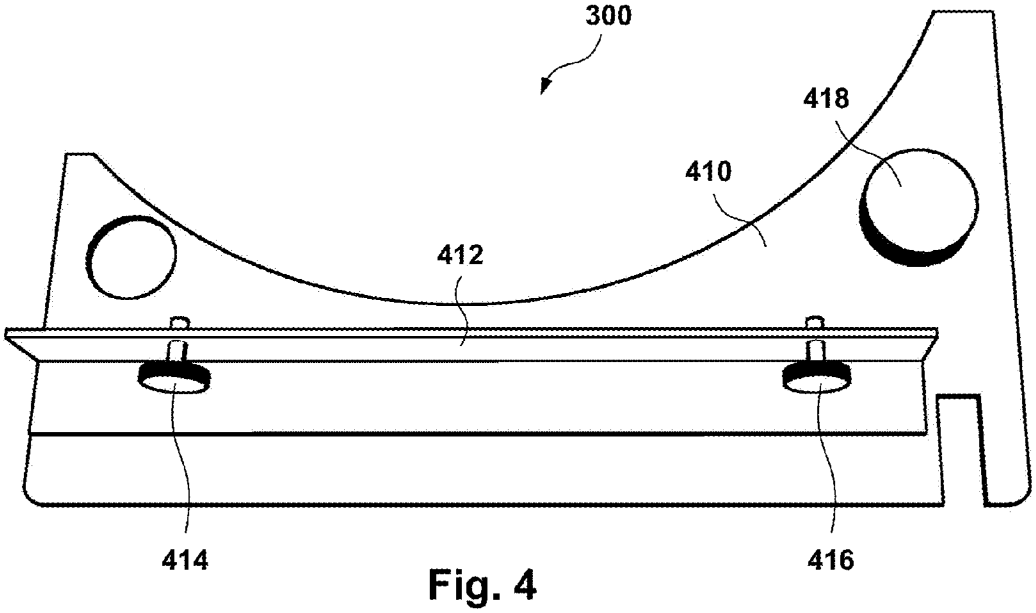
FIG. 4 is a bottom, perspective view of the base shown in FIG. 3.

FIGS. 3 and 4 show a base 300 to which the keypad circuit board 100 is attached. Top and bottom views are shown, respectively. The base 300 rigidly holds the keypad and helps it to withstand repeated use. As seen in FIG. 3, the base 300 includes a top surface 310, which has approximately the same dimensions and shape as the keypad circuit board 100. The base 300 also includes a hole 312, which is aligned with the hole 118 of the keypad, and a cutout region 314, which is aligned with the connector 210. When the keypad circuit board 100 is attached to the base 300, the connector 210 extends through the cutout region 314 in the base 300 to provide access from below.

As seen in FIG. 4, the base 300 has a bottom surface 410 and a member, such as a bracket 412, which extends perpendicularly from the bottom surface 410. Stabilizers, such as thumb screws 414 and 416, are screwed into threaded holes in the bracket 412 and may be advanced and retracted therein. The base 300 also includes a cylindrical protrusion, such as a cylinder 418, which extends perpendicularly from the bottom surface 410 of the base.

Preferably, the base 300 is made of a rigid material, such as steel sheet metal. In the exemplary embodiment, the bracket 412 and cylinder 418 are also made of metal and are welded to the bottom surface 410 of the base 300.

Figure 6:
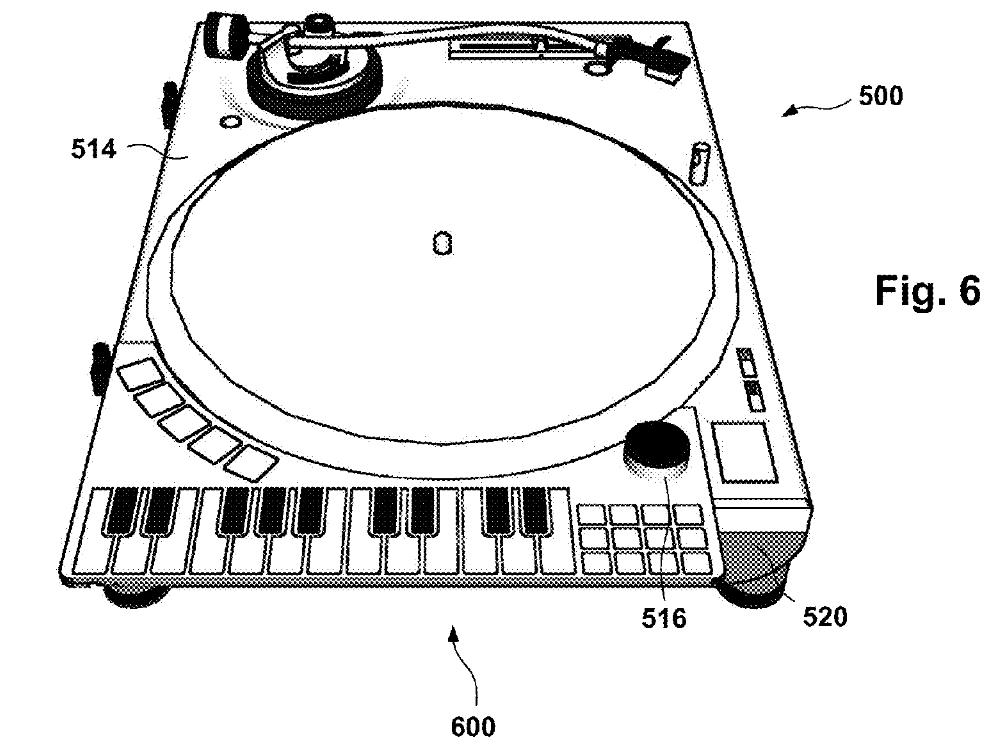
FIG. 6 is a top, perspective view of the turntable of FIG. 5 equipped with a keypad assembly including the keypad of FIGS. 1 and 2 attached to the base of FIGS. 3 and 4.
Figure 7:
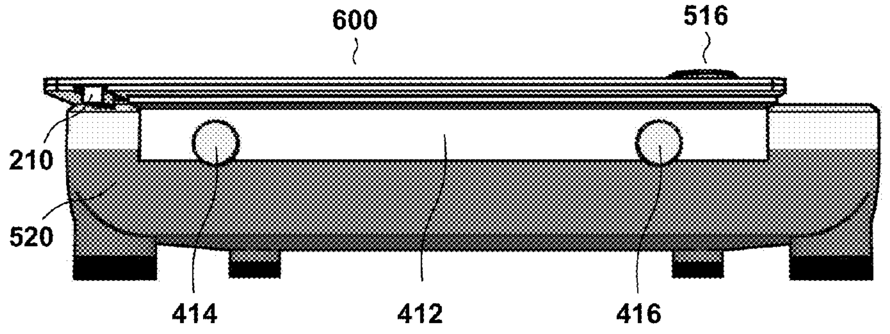
FIG. 7 is a side, perspective view of the turntable of equipped with the keypad.

The keypad circuit board 100 is attached to the base 300 to form a keypad assembly 600 (See FIGS. 6 and 7). In the exemplary embodiment, an insulating sheet, such as Mylar, is glued between the bottom surface of the keypad circuit board 100 and the base 300, to prevent short circuits. The keypad circuit board 100 may be attached to the base using adhesives, screws, or other suitable types of fixation.

Figure 5:
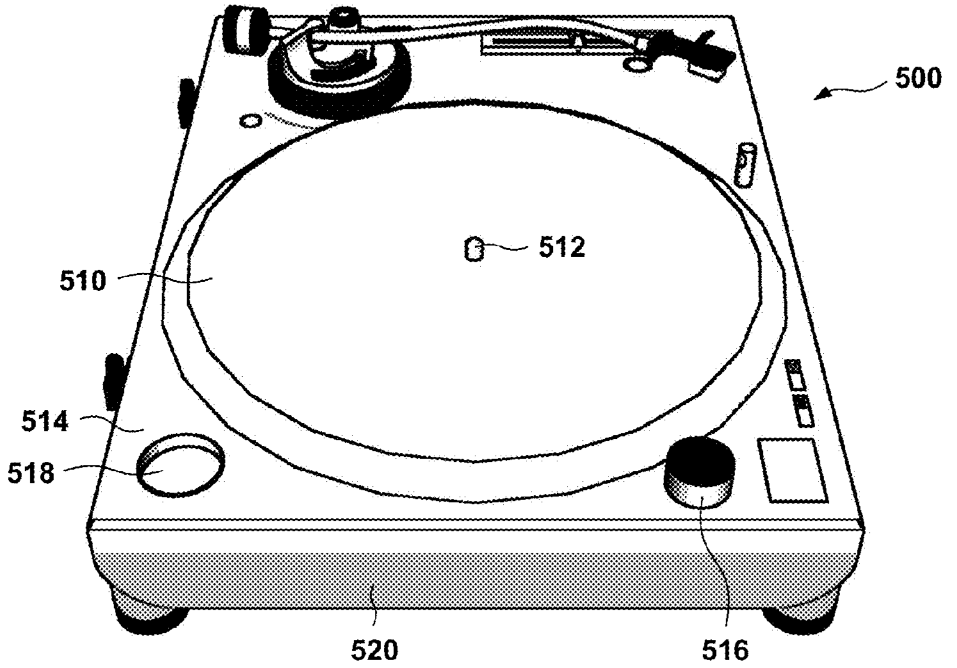
Fig. 5 (Prior Art)
FIG. 5 is a top, perspective view of turntable.

FIG. 5 shows a conventional phonograph turntable 500. The specific type of turntable shown is a Technics model SL-1210, available from Panasonic Corporation. The turntable 500 includes a platter 510, which rotates about a spindle 512. The turntable also includes a top surface 514, a post 516, a depression 518, and a side surface 520. Vinyl records are typically spun on the platter 510. The post 516 is fixedly attached to the surface 514 and houses electronic controls. The depression 518 is unoccupied, but normally holds an adapter for playing 45 RPM records.

FIG. 6 shows a keypad assembly 600 attached to a turntable 500. The keypad assembly 600 is placed over the edge of the turntable 500, with its piano-style keys 120 facing out. The circular edge 110 of the keypad runs concentrically with the platter 510, and is slightly offset from the platter to prevent direct contact. The keypad assembly (or simply, "keypad") 600 is placed so that the bottom surface 410 of the base 300 lies flush against the top surface 514 of the turntable 500. The post 516 on the turntable extends through the holes 118 and 312 of the keypad circuit board 100 and base 300, and the cylinder 418 on the base 300 enters the depression 518 of the turntable. The engagement of the post 516 with the holes 118 and 312 forms a horizontal anchor, which resists translation of the keypad 600 along the plane of the top surface 514 of the turntable 500. Similarly, the engagement of the cylinder 418 with the depression 518 forms a horizontal anchor with the same effect.

FIG. 7 shows the side of the turntable 500 with the keypad 600 in place. The connector 210 is accessible from below. The bracket 412 extends down, parallel to the side surface 520 of the turntable, and the thumbscrews 414 and 416 are advanced against the side surface 520. By tightening the thumbscrews 414 and 416, the keypad 600 pulls back against the post 516 and the depression 518, effectively clamping the keypad 600 to the side of the turntable 500.

Figure 8:
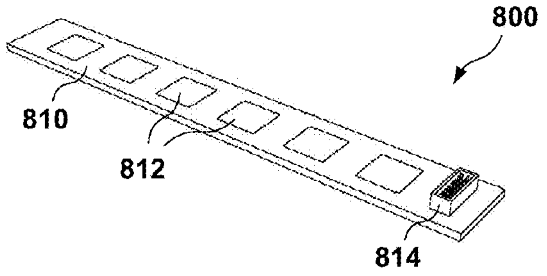
FIG. 8 is a perspective view of a keypad "stick."

FIG. 8 shows a keypad "stick" 800. Like the keypad circuit board 100, the keypad stick 800 includes an insulative substrate 810, keys 812, and a connector 814. As with the keypad circuit board 100, the keys 812 of the keypad sticks are preferably membrane switches and are wired, in matrix fashion, to the connector 814. The keypad sticks 800 are typically small (approximately 20 cm by 2.5 cm) and may be located on or around the turntable, or in any convenient location to provide input to a computer or computing device during DJ performances.

Figure 9:
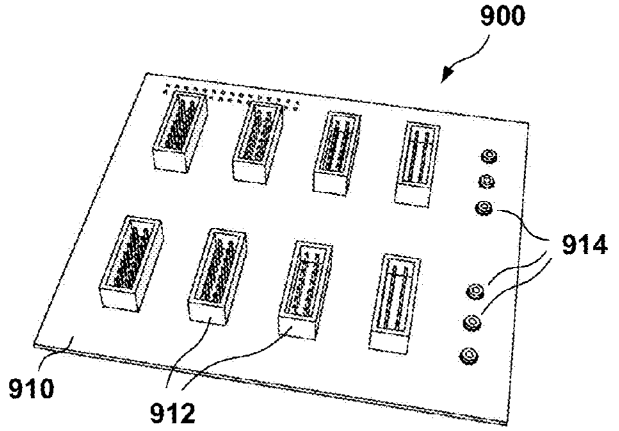
FIG. 9 is a top, perspective view of a hub to which keypads as shown in FIGS. 1-2 and keypad sticks as shown in FIG. 8 may be connected.
Figure 10:
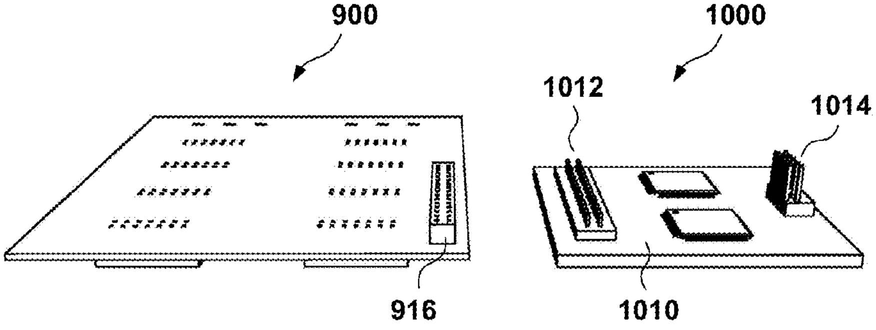
FIG. 10 is a perspective view of both the hub of FIG. 9 and a keypad interface.

FIGS. 9 and 10 show a hub 900 and keypad interface, such as a matrix card 1000. The hub 900 includes a circuit board 910, input connectors 912, phono plugs 914, and an output connector 916. In the embodiment shown, there are eight input connectors 912, each being a 14-pin DIN connector, and six phono plugs. The output connector 916 is preferably a 30-pin DIN connector. In normal use, keypads 600 and sticks 800 are preferably connected to the hub 900 using ribbon cable (i.e., ribbon cables connect between the connectors 210 of the keypads 600 and some of the connectors 912 of the hub, and between the connectors 814 of the sticks and others of the connectors 912 of the hub). Row and column signals from the input connectors 912 and phono plugs 914 are combined at the output connector 916. Some row and column signals are shared among different connectors 912, so the mapping between conductors of the input connectors 912 and those of the output connector 916 need not be one-to-one.

The matrix card 1000 includes a circuit board 1010, an input connector 1012, and an interface connector 1014. The input connector 1012 on the matrix board preferably mates with the connector 916 on the hub 900, for receiving row and column signals from the various keypads and switches connected to the hub 900. The interface connector 1014 is preferably attached to a cable (not shown), such as a USB cable, for allowing the matrix card 1000 to be connected to a computer or other digital device.

The matrix card 1000 includes circuitry for scanning row and column signals from its connector 1012 to determine which keys and/or switches have been activated. The matrix card has an internal key map, which associates each switch in its matrix space with a programmed sequence of computer keystrokes and/or pointer commands. When a key on any keypad is pressed, or when any switch connected to the hub 900 is thrown, the matrix card 1000 identifies the stored sequence for that switch and outputs the sequence to a receiving device (e.g., a computer) over its computer interface connector 1014 and cable.

In the preferred embodiment, the matrix card 1000 is an X-Keys SE® USB Keyboard Matrix Control Board from P.I. Engineering, Inc. of Williamston, Mich. A The matrix space of the X-Keys SE includes 8 rows and 16 columns. This matrix space supports a total of 8×16=128 different switches. This is large enough to support three keypads 600, one stick 800, and five foot petals, or two keypads 600, eight sticks 800, and two foot pedals. Many other combinations may be realized.

The X-Keys SE is programmable using X-Keys Macro Works software. Using the Macro Works software, arbitrary sequences of keystrokes and/or mouse commands may be associated with any switch in the matrix space of the X-Keys SE and stored in a non-volatile memory within the card. The X-Keys SE outputs those sequences over its output USB cable in response to keystrokes from keypads and other switches connected to the hub 900. The computer or digital device receiving the sequences interprets them simply as keyboard and/or pointer commands.

Different types of matrix cards are available, and the invention is not limited to the X-Keys SE. In addition, the computer interface connector 1014 and cable need not be USB. Other types of connections can be used, such as PS-2, fire-wire, serial bus, or even wireless connections, such as Bluetooth® or Wi-Fi.

Figure 11:
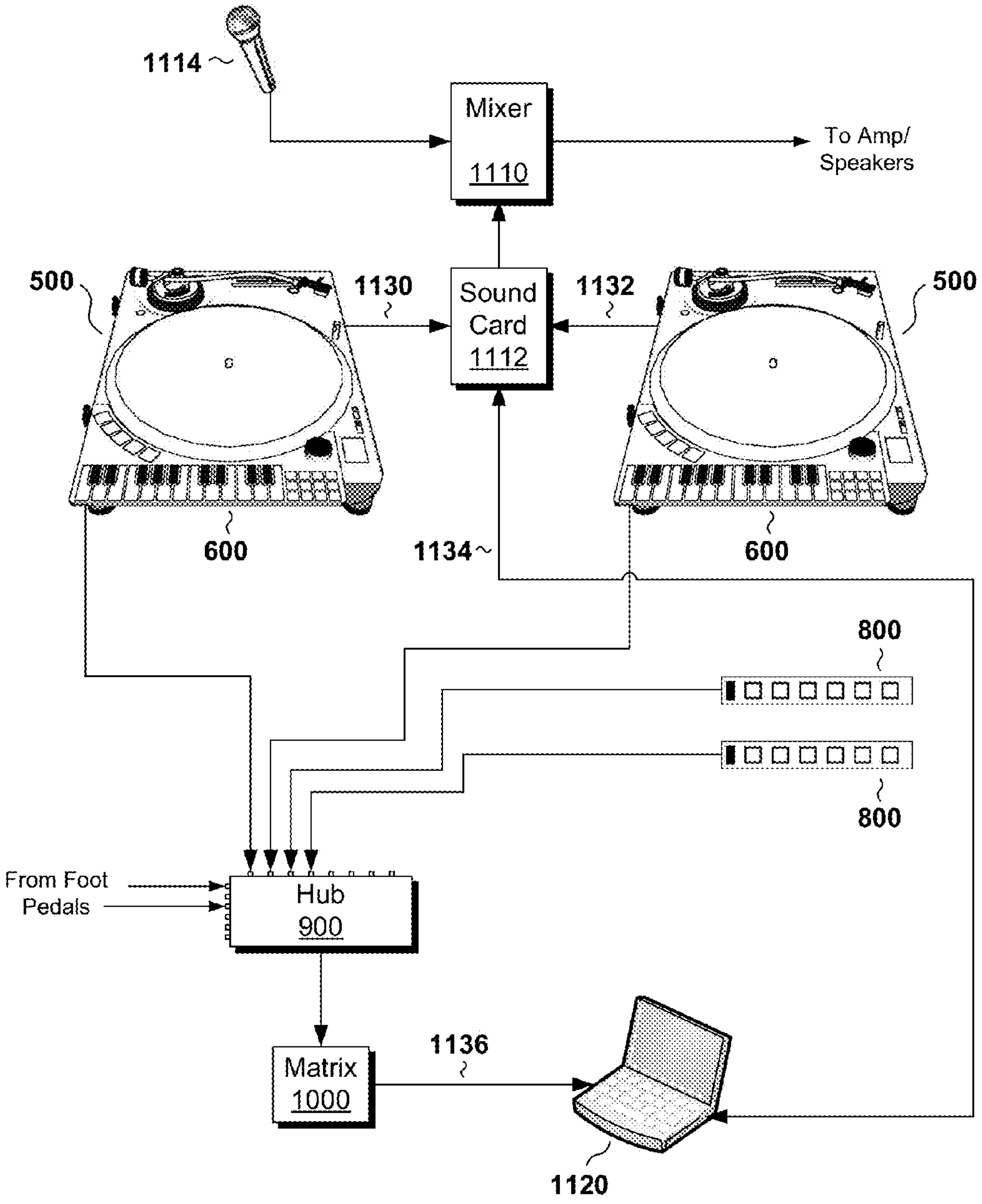
FIG. 11 is a schematic view of a DJ rig including the keypads of FIGS. 1-2, keypad sticks of FIG. 8, hub of FIG. 9, and keypad interface of FIG. 10, as well as other equipment.

FIG. 11 shows an example of a DJ rig that employs the components described hereinabove. The DJ rig includes two turntables 500, each having a keypad 600 attached thereto. Each of the keypads, as well as various sticks 800, is attached to the hub 900, e.g., using ribbon cable. Various foot pedals or other switches may also be attached to the hub 900. The hub 900 is connected to the matrix card 1000. The matrix card is connected to a computing device, such as a computer 1120, via line 1136, which is preferably a USB cable. Pressing a key on any of the keypads or sticks, or depressing any foot pedal or other switch, causes the matrix card 1000 to detect a unique row/column switch closure, which in turn causes the matrix card 1000 to output a predetermined sequence of keyboard and/or pointer commands to the computer. The computer interprets that sequence as native keyboard and/or pointer commands (as if directly entered on the computer), and software running on the computer responds to the sequence according to its own interface programming.

The computer 1120 may be any suitable type, but it is generally a PC or a Mac. The computer 1120 preferably includes installed software, such as Scratch Live, Final Scratch, Traktor, or Torque, for controlling DJ performances.

Also shown in FIG. 11 are a conventional mixer 1110, sound card 1112, and microphone 1114. These are operated in the usual fashion. The sound card 1112 is typically specially designed for DJ requirements. Examples include the Serato SL-1 and SL-3 interfaces. The computer 1120 outputs digital audio signals from a musical selection being played on the computer to the sound card 1112, generally via a USB cable 1134. The sound card 1112 converts the digital audio signals to analog signals, which are sent to the mixer 1110. The mixer 1110 combines the analog signals with audio from the microphone 1114 to produce a mixed audio signal, which is then sent to an amplifier and loudspeakers. In addition, the turntables 500 are connected to the sound card 1112 via turntable audio output cables 1130 and 1132. When the turntables play time-encoded disks, these cables convey time-encoded signals to the sound card 1112. The time-encoded signals are then sent back to the computer 1120, via the cable 1134, for controlling the speed and direction (forward or reverse) of playback.

In a typical DJ rig, two turntables 500 are placed side-by-side with the mixer 1110 between them. The turntables 500 are positioned so that the keypads 600 face forward, toward the DJ. With this arrangement, the DJ can manipulate the records (scratch, speed up, slow down, etc.) and press keys on the keypads 600, which are optimally positioned for this purpose. The DJ does not need to swivel and reorient to control the computer. The controls are directly in front of the DJ and very close to his or her normal hand position. Not only are the keys conveniently located, but also they are always in the same position from one performance to the next. Over time, a DJ can therefore become very skilled at integrating control of the software via the keypad 600 with the normal functions the DJ performs on the vinyl records. The quality of DJ performances is likely to improve as a result of the convenience and consistency of location afforded by the keypads 600.

Keys on the keypads 600 and sticks 800 can be pre-programmed at will to jump to specific points in playback, loop specific segments of audio, set jump points, and perform a myriad of other tasks. These may include non-audio tasks, such as activating strobe lights, fog machines, and other performance equipment. The functionality of the keypads is limited only by the software and hardware to which they connect.

The piano-style keys can be programmed to perform any desired function, just as any other keys. However, they are optimally suited for playing musical notes. For example, a DJ can program the piano-style keys using DJ software to play MIDI notes when the keys are pressed. The DJ is thus able to seamlessly integrate his or her own musical input into a performance.

Some may question how a keypad can be mounted to a turntable without causing the record to skip whenever a key is pressed. As is known, DJ software commonly provides a "relative mode." When used with time-encoded disks, relative mode ignores skips and focuses only on the time and/or pitch data read from a time-encoded record. We have recognized and confirmed, that any skipping caused by pressing keys does not affect playback or negatively affect the DJ's performance when relative mode is used.

Having described one embodiment, numerous alternative embodiments or variations can be made. For example, it is not necessary that base 300 of the keypad be made of metal. Other rigid materials may be used, such as plastic. The bracket 412 and cylinder 418 may be formed integrally with the base, rather than being welded to the base. They may also be attached in some fashion other than welding. Although membrane switches on the keypads 600 and sticks 800 are preferred for durability and longevity, they are not required. Other types of switches or keys may be used, such as spring-loaded keys or rubber keys, for example. According to one variant, the keys are translucent or transparent and include LEDs or other backlighting to illuminate when pressed.

As shown and described, thumbscrews 414 and 416 are used to clamp the keypad 600 to the turntable 500. However, other types of stabilizers may be used. These include one or more spring-loaded pins that extend interiorly toward the side 520 of the turntable. The use of a rigid bracket 412 and screws or spring-loaded pins is just examples of a clamping member. Another solution is to make the bracket 412 of a flexible material and to form it to normally tilt or bulge inwardly, toward the side surface 520 of the turntable, so that the bracket elastically bends when installed on the turntable and holds the keypad 600 in place by compression.

As shown and described, the keypad 600 is connected to an external hub 900, which is in turn connected to a matrix card 1000. However, this arrangement is not required. Alternatively, each keypad 600 can be equipped with its own matrix card, with the output of the keypad 600 being a USB or other type of computer-compatible cable. The keypad is operated simply by plugging its cable into a computer. With a matrix card on each keypad, multiple keypads can still be used, each plugging into a different port on the computer. An external hub (e.g., a USB hub) may be provided if the number of keypads exceeds the number of ports available on the computer or if doing so simplifies cable routing.

As shown and described, the hub 900 and matrix card 1000 are separate circuit boards. Alternatively, their functions may be provided on a single circuit board.

As shown and described, the keypad 600 is a separate device which may be attached to a turntable. This is not required, however. Alternatively, the keypad 600 may be physically integrated with the turntable itself. For example, the turntable 500 may include keys on its top surface 514 or on some other accessible surface. The keys may be wired to the switching hub 900 for connection to the matrix card 1000, or the matrix card may be integrated within the turntable. According to one variant, the turntable includes a converter for converting its analog audio output into a digital signal. The digital signal is combined with output from the matrix card and sent to the computer using a single cable, such as a USB cable.

It is not essential that the Panasonic SL-1210 turntable be used. Most turntables, even from different vendors, have similar physical features, or can be modified to have features performing similar functions, and the keypad 600 can generally be made to attach to those turntables.

As shown and described, the keypad 600 includes a horizontal anchor consisting of both a hole 118/312 and a cylindrical protrusion 418. However, both the hole and the protrusion are not required. Alternatively, only one or the other may be used. In addition, other types of anchors may be used. These include adhesives, screws, and vertical members that extend down from the keypad 600 and/or up from the turntable for anchoring the keypad's relative horizontal position with respect to the turntable 500.

Although the computing device 1120 is generally a computer, this is not required. It may alternatively be any computing device capable of responding to keyboard and/or pointer commands, including, for example, personal data assistants, smart phones, MP3 players, and tablet computing devices, such as the iPad.

The keypad 600 is shown and described in connection with turntables for playing vinyl, time-encoded records. However, it can also be used with CDJ's, i.e., compact disk players designed to emulate turntables used by DJ's. Instead of having a platter on top of the unit, CDJ's have a "jog dial," which allows DJs to introduce musical effects. An example of a CDJ is the Pioneer CDJ-1000. When the keypad 600 is used with a CDJ, the front, circular arc of the keypad can run concentrically with the jog dial, and the keypad can be attached to the CDJ and operated substantially as described above. Bearing this in mind, the term "turntable" as used herein is therefore intended to include not only vinyl record turntables but also devices designed to emulate vinyl record turntables, including CDJs and similar devices. Similarly, the term "platter" as used herein is intended to include not only the surface upon which a vinyl record is placed on a turntable, but also the jog dial of a CDJ, which has a similar shape and position, and can be operated by a DJ in a similar fashion.

Those skilled in the art will therefore understand that various changes in form and detail may be made to the embodiments disclosed herein without departing from the scope of the invention.

What is claimed is:

1. A keypad for controlling disk jockey software from a location of a turntable, the keypad comprising:

a top surface having a plurality of keys and an edge having the shape of a concave circular arc;

a bottom surface; and a vertical member extending down from the bottom surface to engage a vertical depression on the turntable and to stabilize the keypad with respect to the turntable.

2. The keypad of claim 1, wherein the vertical member has a cylindrical shape.

3. The keypad of claim 2, wherein the vertical member has a diameter that substantially matches the diameter of a standard 45 RPM adapter.

4. The keypad of claim 1, wherein the keys made of translucent rubber, and wherein the keypad further includes light emitting diodes (LEDs) to illuminate the keys when pressed.

5. The keypad of claim 1, further comprising an adhesive that extends down from the bottom surface for adhering the keypad to the turntable.

6. The keypad of claim 1, wherein the keypad includes circuitry constructed and arranged to respond to key presses of keys of the keypad to send keyboard and/or pointer commands to a computing device coupled to the keypad.

7. The keypad of claim 1, further comprising a bracket extending down from the bottom surface of the keypad, for facilitating attachment of the keypad to the turntable.

8. The keypad as recited in claim 7, wherein the plurality of keys includes multiple piano-style keys.

9. A method of using the keypad of claim 1, the method comprising placing the keypad on the turntable such that the edge having the shape of the concave circular arc extends adjacent to a platter of the turntable and follows a curvature of the platter.

10. The method of claim 9, wherein the placing the keypad on the turntable causes the edge having the concave circular arc to run concentrically with the platter.

11. The method of claim 9, further comprising engaging the vertical member extending down from the bottom surface into the vertical depression of the turntable.

12. The method of claim 9, further comprising pressing a key on the keypad to send a keyboard and/or pointer command to a computing device to provide input to disk jockey software running on the computing device.

13. The method of claim 12, further comprising sending a keyboard and/or pointer command in response to a first key of the keypad being pressed to direct the computing device to jump to a specific point in playback.

14. The method of claim 13, further comprising sending a keyboard and/or pointer command in response to a second key of the keypad being pressed to direct the computing device to loop a specific segment of audio.

15. The method of claim 14, further comprising sending a keyboard and/or pointer command in response to a third key of the keypad being pressed to direct the computing device to set a jump point in a segment of audio.

16. A keypad for controlling disk jockey software from a location of a turntable, the keypad comprising:

a top surface having a plurality of keys and an edge having the shape of a concave circular arc;

a bottom surface; and a horizontal anchor, formed within or extending from the bottom surface, for engaging the turntable.

17. The keypad of claim 16, further comprising a clamping member extending from the surface of the keypad, for clamping to a side surface of the turntable.

18. The keypad of claim 16, wherein the horizontal anchor comprises a hole through the keypad.

19. The keypad of claim 16, wherein the horizontal anchor comprises a vertical member extending down from the bottom surface of the keypad.

20. The keypad of claim 16, wherein the horizontal anchor comprises adhesive extending down from the bottom surface of the keypad.

* * * * *